(12) United States Patent
Yu et al.

(10) Patent No.: US 9,812,327 B2
(45) Date of Patent: Nov. 7, 2017

(54) SEMICONDUCTOR DEVICE AND METHOD OF FORMING THE SAME

(71) Applicant: United Microelectronics Corp., Hsinchu (TW)

(72) Inventors: Kun-Huang Yu, New Taipei (TW); Shih-Yin Hsiao, Chiayi County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/863,177

(22) Filed: Sep. 23, 2015

(65) Prior Publication Data

US 2017/0062444 A1 Mar. 2, 2017

(30) Foreign Application Priority Data

Aug. 24, 2015 (CN) .......................... 2015 1 0521058

(51) Int. Cl.
| | | |
|---|---|---|
| *H01L 21/28* | (2006.01) | |
| *H01L 29/423* | (2006.01) | |
| *H01L 27/11536* | (2017.01) | |
| *H01L 27/11539* | (2017.01) | |

(52) U.S. Cl.
CPC .. *H01L 21/28273* (2013.01); *H01L 27/11536* (2013.01); *H01L 27/11539* (2013.01); *H01L 29/42336* (2013.01)

(58) Field of Classification Search
None
See application file for complete search history.

(56) References Cited

U.S. PATENT DOCUMENTS

| | | | | |
|---|---|---|---|---|
| 5,146,426 | A * | 9/1992 | Mukherjee | ............ H01L 27/115 257/261 |
| 8,829,588 | B2 | 9/2014 | Horch | |
| 2004/0248371 | A1* | 12/2004 | Wang | .................... H01L 27/115 438/330 |
| 2005/0042826 | A1* | 2/2005 | Chang | .................. H01L 27/115 438/258 |
| 2005/0087796 | A1* | 4/2005 | Jung | ..................... H01L 27/115 257/315 |
| 2007/0020857 | A1* | 1/2007 | Chindalore | ............ B82Y 10/00 438/270 |
| 2007/0187746 | A1* | 8/2007 | Kashimura | ........... H01L 27/115 257/315 |

* cited by examiner

*Primary Examiner* — Khaja Ahmad
(74) *Attorney, Agent, or Firm* — J.C. Patents

(57) ABSTRACT

Provided is a memory device including a first gate, a second gate and an inter-gate dielectric layer. The first gate is buried in a substrate. The second gate includes metal and is disposed on the substrate. The inter-gate dielectric layer is disposed between the first and second gates. A method of forming a memory device is further provided.

13 Claims, 9 Drawing Sheets

SEMICONDUCTOR DEVICE AND METHOD OF FORMING THE SAME

CROSS-REFERENCE TO RELATED APPLICATION

This application claims the priority benefit of China patent application serial no. 201510521058.5, filed on Aug. 24, 2015. The entirety of the above-mentioned patent application is hereby incorporated by reference herein and made a part of the specification.

BACKGROUND OF THE INVENTION

Field of Invention

The present invention is related to a semiconductor device and a method of forming the same, and more generally to a memory device and a method of forming the same.

Description of Related Art

With the development of a multi-functional chip, integrating elements with different functions, e.g., a memory and a metal-oxide-semiconductor (MOS) transistor, into the same chip has become the mainstream in the market. However, the process for fabricating a memory is commonly separated from the process for fabricating a MOS transistor. Hence, multiple photo-masks and complicated process steps are required, so as to increase the process cost and weaken the competitiveness. Therefore, how to effectively integrate a memory and a MOS transistor has been drawn high attention in the industry.

SUMMARY OF THE INVENTION

Accordingly, the present invention provides a memory device and a method of forming the same, in which a memory device can be fabricated at the same time during the process of forming a metal gate, so as to effectively integrate different elements with different functions into a single chip.

The present invention provides a memory device including a first gate, a second gate and an inter-gate dielectric layer. The first gate is buried in a substrate. The second gate includes metal and is disposed on the substrate. The inter-gate dielectric layer is disposed between the first and second gates.

According to an embodiment of the present invention, a dimension of the second gate is greater than a dimension of the first gate, and the inter-gate dielectric layer is further disposed between the second gate and the substrate.

According to an embodiment of the present invention, the inter-gate dielectric layer includes an oxide-nitride-oxide (ONO) dielectric layer, a high-dielectric-constant (high-k) layer having a dielectric constant of greater than about 10 or a combination thereof.

According to an embodiment of the present invention, the high-k layer includes metal oxide.

According to an embodiment of the present invention, the memory device further includes a tunnel insulating layer disposed between the first gate and the substrate.

According to an embodiment of the present invention, the memory device further includes at least two doped regions disposed in the substrate beside the first gate.

According to an embodiment of the present invention, a depth of the first gate is greater than a depth of the doped regions.

The present invention further provides a memory device including a first gate, a second gate and an inter-gate dielectric layer. The first gate is buried in the substrate. The second gate includes metal and is disposed on the substrate. The inter-gate dielectric layer is disposed between the first gate and the second gate, wherein the inter-gate dielectric layer includes a high-k layer having a dielectric constant of greater than about 10.

According to an embodiment of the present invention, a dimension of the second gate is greater than a dimension of the first gate, and the inter-gate dielectric layer is further disposed between the second gate and the substrate.

According to an embodiment of the present invention, the memory device further includes an interfacial layer disposed between the high-k layer and the first gate.

According to an embodiment of the present invention, the memory device further includes a tunnel insulating layer disposed between the first gate and the substrate.

According to an embodiment of the present invention, the memory device further includes at least two doped regions disposed in the substrate beside the first gate.

According to an embodiment of the present invention, a depth of the first gate is greater than a depth of the doped regions.

The present invention also provides a method of forming a memory device. A substrate having a first area and a second area is provided. The substrate has at least one opening formed in the first area. An insulating layer is formed on a surface of the opening. A first conductive layer is formed in the opening. A first dielectric layer and a second conductive layer are formed on the first conductive layer.

According to an embodiment of the present invention, the method further includes forming a second dielectric layer around the second conductive layer, removing the second conductive layer to form a trench in the second dielectric layer, and filling a third conductive layer in the trench.

According to an embodiment of the present invention, the second conductive layer includes polysilicon, amorphous silicon or a combination thereof, and the third conductive layer includes metal.

According to an embodiment of the present invention, the third conductive layer in the first area and a metal gate in the second area are formed simultaneously.

According to an embodiment of the present invention, the first dielectric layer includes an ONO dielectric layer, a high-k layer having a dielectric constant greater than about 10 or a combination thereof.

According to an embodiment of the present invention, a surface of the first conductive layer is lower than a surface of the substrate.

According to an embodiment of the present invention, the first dielectric layer in the first area and a high-k layer below a metal gate in the second area are formed simultaneously.

In view of the above, in the memory device of the invention, a floating gate is buried in the substrate, and a control gate is fabricated simultaneously and formed at the same levels with a metal gate in a periphery area are. In the present invention, a memory device and a MOS transistor device can be easily integrated together with the existing high-k and metal gate process, so the process cost is significantly reduced and the competitiveness is greatly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
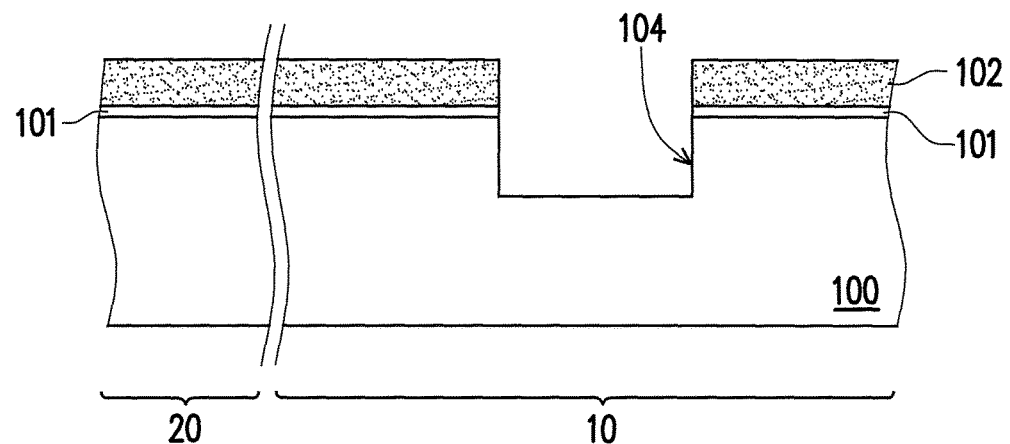
FIG. 1A to FIG. 1H are schematic cross-sectional views of a method of forming a semiconductor device according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like elements.

FIG. 1A to FIG. 1H are schematic cross-sectional views of a method of forming a semiconductor device according to an embodiment of the present invention.

Referring to FIG. 1A, a substrate 100 is provided. The substrate 100 can be a semiconductor substrate, such as a silicon-containing substrate. The substrate 100 has a first area 10 and a second area 20. In an embodiment, the first area 10 can be a cell area, second area 20 can be a periphery area. In another embodiment, the first area 10 can be a memory device area, and the second area 20 can be a MOS device area or a low-voltage device area, but the present invention is not limited thereto. In an embodiment, the substrate 100 has a pad oxide layer 101 and a mask layer 102 formed thereon. The pad oxide layer 101 includes silicon oxide, and the forming method thereof includes preforming a thermal oxidation process. The mask layer 102 includes silicon nitride, and the forming method thereof includes performing a suitable deposition process such as a chemical vapour deposition (CVD) and a subsequent patterning step such as a photolithography and etching process. Thereafter, a portion of the substrate 100 is removed by using the mask layer 102 as a mask, so as to form at least one opening 104 in the substrate 100 in the first area 10. The method of removing the portion of the substrate 100 includes performing an etching process.

Figure 1B:
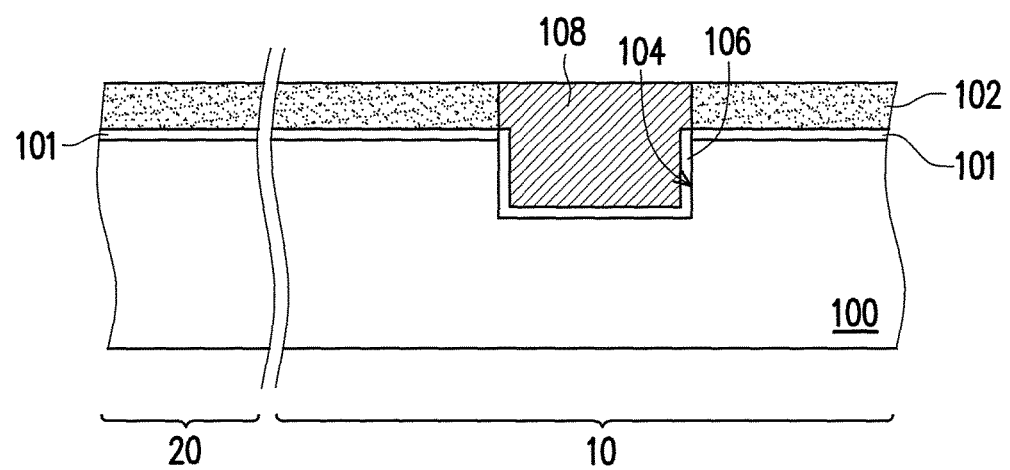

Referring to FIG. 1B, an insulating layer 106 is formed on the surface of the opening 104. The insulating layer 106 includes silicon oxide, and the forming method thereof includes performing a thermal oxidation process. Afterwards, a conductive layer 108 is filled in the opening 104. In an embodiment, the surface of the conductive layer 108 is substantially coplanar with the surface of the mask layer 102. The conductive layer 108 includes polysilicon, amorphous silicon or a combination thereof. The method of forming the conductive layer 108 includes performing a suitable deposition process (e.g., CVD) to form a conductive material layer (not shown) on the substrate 100 filling in the opening 104. Thereafter, a chemical mechanical polishing (CMP) process is performed by using the mask layer 102 as a polish stop layer, so as to remove the conductive material layer outside of the opening 104.

Figure 1C:
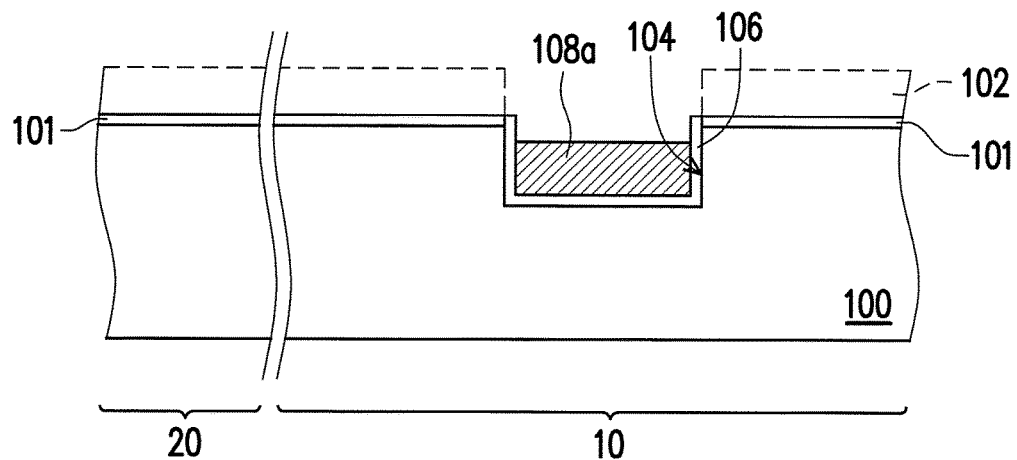

Referring to FIG. 1C, a portion of the conductive layer 108 is removed, so the surface of the remaining conductive layer 108a is no higher than the surface of the substrate 100. In an embodiment, the surface of the conductive layer 108a is lower than the surface of the substrate 100, as shown in FIG. 1C. However, the present invention is not limited thereto. In another embodiment, the surface of the conductive layer 108a is substantially coplanar with the surface of the substrate 100. The method of removing the portion of the conductive layer 108 includes performing an etching back process. The mask layer 102 is then removed.

Figure 1D:
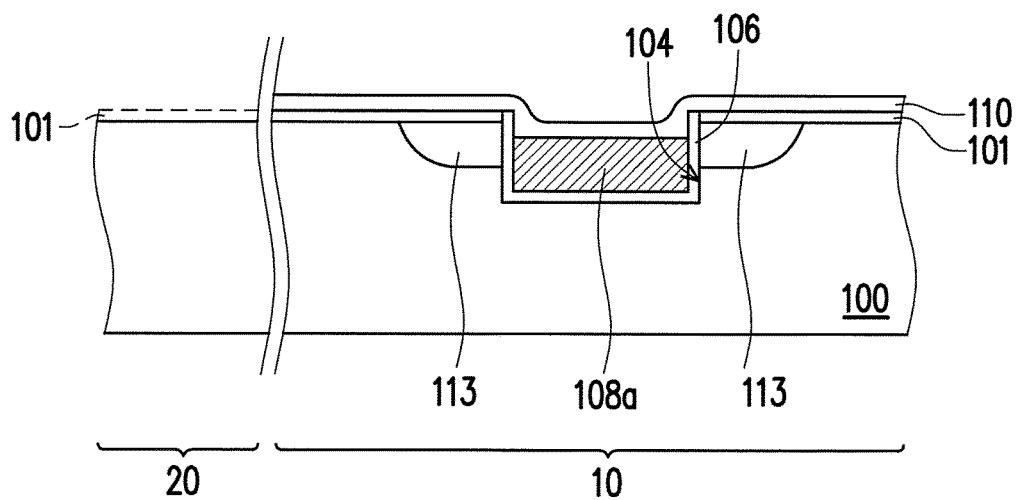

Referring to FIG. 1D, an oxide-nitride-oxide (ONO) dielectric layer 110 is formed on the substrate 100 in the first area 10. In an embodiment, the distance from the surface of the conductive layer 108a to the surface of the substrate 100 is substantially equal to the thickness of the ONO dielectric layer 110, so the surface of the ONO dielectric layer 110 above the conductive layer 108a is substantially coplanar with the surface of the substrate 100. The method of forming the ONO dielectric layer 110 includes performing multiple deposition processes (e.g., CVD), so as to form an ONO dielectric material layer (not shown) on the substrate 100 in the first area 10 and in the second area 20. Thereafter, the ONO dielectric material layer in the second area 20 is removed. In an embodiment, a photoresist layer (not shown) is formed on the ONO dielectric material layer to cover the first area 10 and expose the second area 20. Thereafter, the ONO dielectric material layer exposed by the photoresist layer is removed.

Afterwards, at least two doped regions 113 are formed in the substrate 100 beside the conductive layer 108a. The method of forming the doped regions 113 includes performing an ion implantation process. In an embodiment, the depth of the doped regions 113 is less than the depth of the conductive layer 108a. Besides, the doped regions 113 is in contact with the sidewall of the opening 102. In the said embodiment, the ONO dielectric layer 110 is formed prior to the formation of the doped regions 113, but the present invention is not limited thereto. In another embodiment, the ONO dielectric layer 110 can be formed after the formation of the doped regions 113. Thereafter, an etching process is performed to remove the pad oxide layer 101 on the substrate 100 in the second area 20.

Figure 1E:
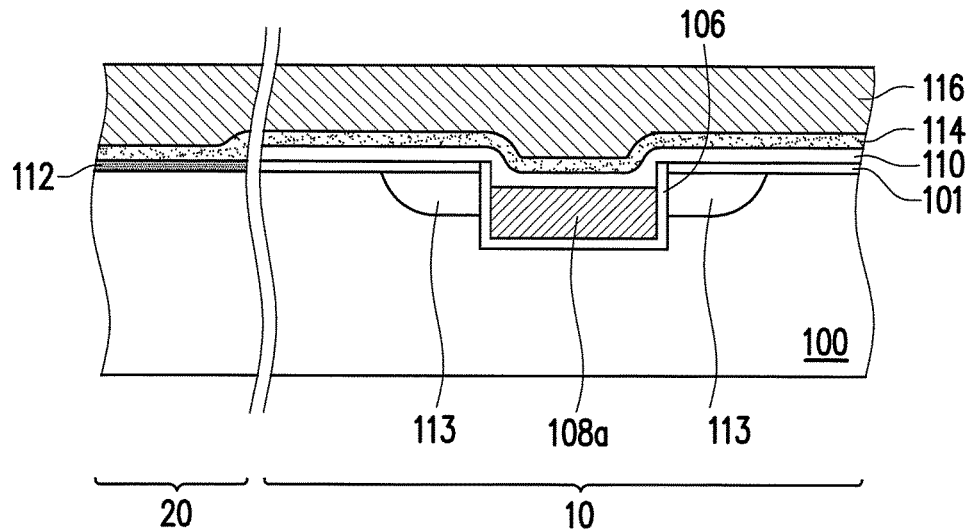

Referring to FIG. 1E, an interfacial layer 112 is formed on the substrate 100 in the second area 20. The interfacial layer 112 includes silicon oxide. In an embodiment, when the interfacial layer 112 is formed by a thermal oxidation process, the interfacial layer 112 is formed on the substrate 100 merely in the second area 20. In another embodiment, when the interfacial layer 112 is formed by a deposition process such as CVD, the interfacial layer 112 is formed on the ONO dielectric layer 110 in the first area 10 and on the substrate 100 in the second area 20.

Thereafter, a high-dielectric-constant (high-k) layer 114 is formed on the substrate 100 in the first and second areas 10 and 20. In an embodiment, the high-k layer 114 covers the ONO dielectric layer 110 in the first area 10 and the interfacial layer 112 in the second area 20. The method of forming the high-k layer 114 includes performing a suitable deposition process such as CVD. In an embodiment, the high-k layer 114 can be a high-k layer with a dielectric constant greater than about 4, greater than about 7 or greater than about 10. For example, the high-k layer 114 includes metal oxide, such as rare earth metal oxide. The high-k material can be selected from the group consisting of hafnium oxide (HfO$_2$), hafnium silicon oxide (HfSiO$_4$), hafnium silicon oxynitride (HfSiON), aluminum oxide (Al$_2$O$_3$), lanthanum oxide (La$_2$O$_3$), tantalum oxide (Ta$_2$O$_5$), yttrium oxide (Y$_2$O$_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate, (SrBi$_2$Ta$_2$O$_9$, SBT), lead zirconate titanate (PbZr$_x$Ti$_{1-x}$O$_3$, PZT), and barium strontium titanate (Ba$_x$Sr$_{1-x}$TiO$_3$, BST), wherein x is between 0 and 1.

Thereafter, a conductive material layer 116 is formed on the high-k layer 114 in the first and second areas 10 and 20. The conductive material layer 116 includes polysilicon, amorphous silicon or a combination thereof, and the forming method thereof includes performing a suitable deposition process such as CVD.

Figure 1F:
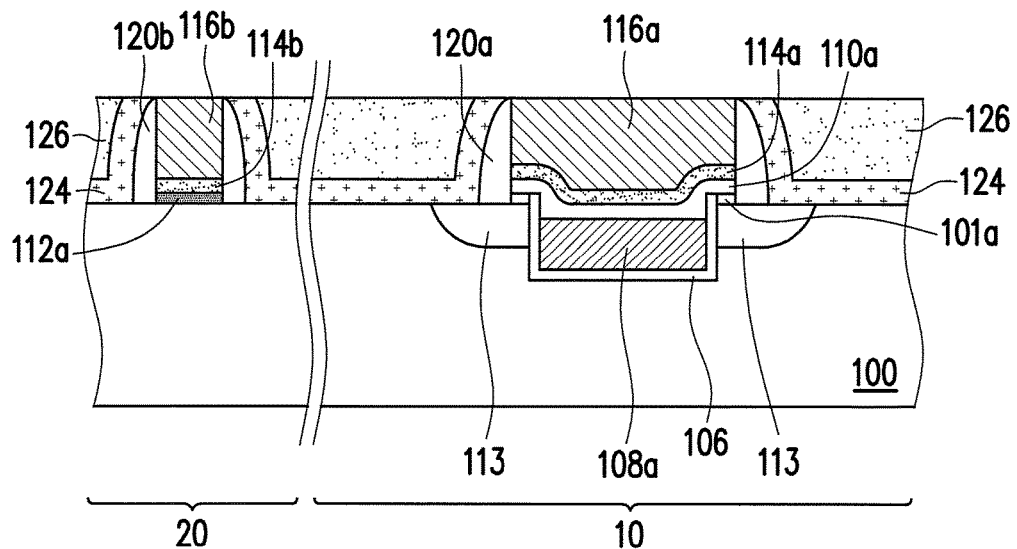

Referring to FIG. 1F, the conductive material layer 116 and the high-k layer 114 are patterned, so as to form a conductive layer 116a and an underlying high-k layer 114a on the substrate 100 in the first area 10, and simultaneously form a conductive layer 116b and an underlying high-k layer 114b on the substrate 100 in the second area 20. The patterning step includes performing a photolithography and etching process. In an embodiment, this patterning step can simultaneously remove a portion of the ONO dielectric layer 110, so the remaining ONO dielectric layer 110a is formed below the high-k layer 114a. In an embodiment, this patterning step can simultaneously remove a portion of the interfacial layer 112, so the remaining interfacial layer 112a is formed below the high-k layer 114b. In an embodiment, this patterning step can simultaneously remove a portion of the pad oxide layer 101, so the remaining pad oxide layer 101a is formed between the ONO dielectric layer 110a and the substrate 100.

Thereafter, a dielectric layer 126 is formed around the conductive layers 116a and 116b. In an embodiment, the dielectric layer 126 surrounds the sidewalls and exposes the tops of the conductive layers 116a and 116b. The dielectric layer 126 includes silicon oxide, borophosphosilicate glass (BPSG), phosphosilicate glass (PSG), undoped silicate glass (USG), fluorosilicate glass (FSG), spin-on glass (SOG), or a low-k material with a dielectric constant lower than about 4. The method of forming the dielectric layer 126 includes perform a spin coating process or a suitable deposition process such as CVD. In an embodiment, before the step of forming the dielectric layer 126, spacers 120a and 120b can be respectively formed on the sidewalls of the conductive layers 116a and 116b, and an etch sop layer 124 can be formed between the dielectric layer 126 and each of the spacers 120a and 120b and between the dielectric layer 126 and the substrate 100.

Figure 1G:
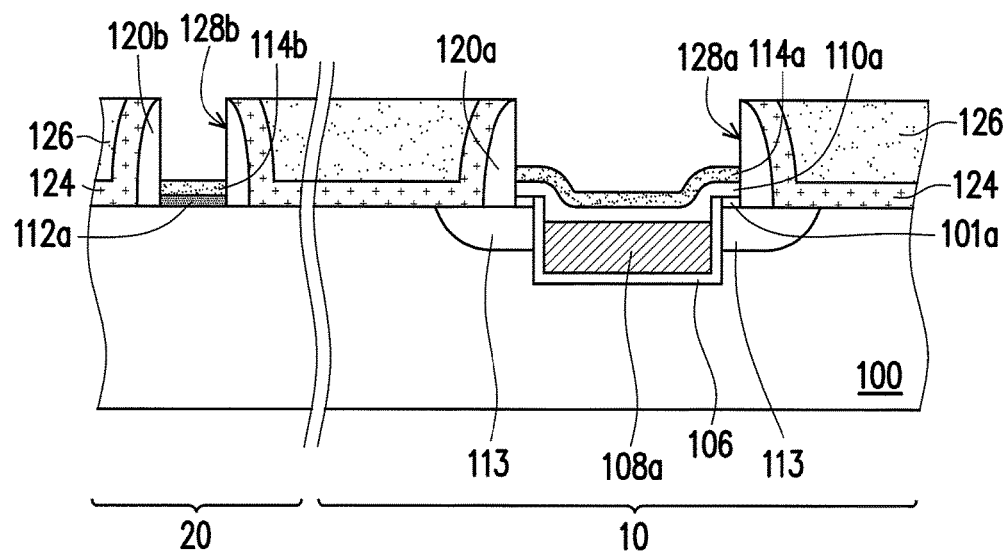

Referring to FIG. 1G, the conductive layers 116a and 116b are removed to form trenches 128a and 128b in the dielectric layer 126. The step of removing the conductive layers 116a and 116b includes performing an etching process. In this embodiment, the trenches 128a and 128b respectively expose the high-k layers 114a and 114b.

Figure 1H:
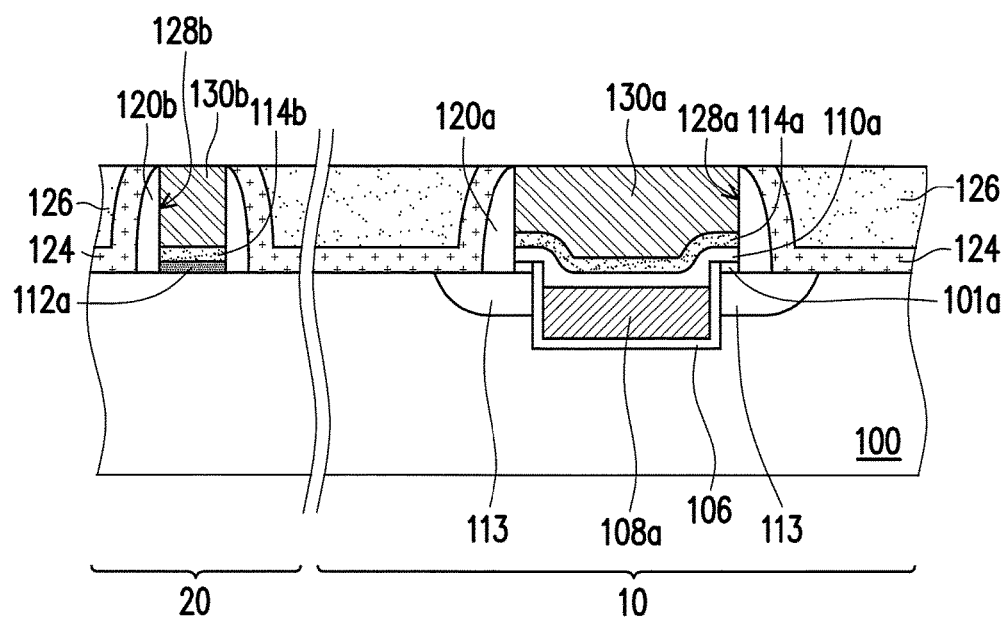

Referring to FIG. 1H, conductive layers 130a and 130b are respectively filled in the trenches 128a and 128b. Each of the conductive layers 130a and 130b includes metal. In an embodiment, each of the conductive layers 130a and 130b includes a work function metal layer and a low resistivity metal layer (not shown). The work function metal layer includes titanium nitride (TiN), titanium carbide (TiC), tantalum nitride (TaN), tantalum carbide (TaC), tungsten carbide (WC), aluminum titanium nitride (TiAlN), titanium aluminide (TiAl), zirconium aluminide (ZrAl), tungsten aluminide (WAl), tantalum aluminide (TaAl), hafnium aluminide (HfAl) or a combination thereof. The low resistivity metal layer includes Cu, Al or an alloy thereof.

The method of forming the conductive layers 130a and 130b includes performing at least one suitable deposition process such as CVD, so as to form a metal material layer (not shown) on the substrate 100 filling in the trenches 128a and 128b in the first and second areas 10 and 20. Thereafter, a CMP process is performed by using the dielectric layer 126 as a polish stop layer, so as to remove the metal material layer outside of the trenches 128a and 128b. The fabrication of the semiconductor device of the invention is thus completed.

In this embodiment, in the memory device in the first area 10, the insulating layer 106 serves as a tunnel insulating layer, the conductive layer 108a serves as a floating gate, the ONO dielectric layer 110a and high-k layer 114a together serve as an inter-gate dielectric layer, and the conductive layer 130a serves as a control gate. In the MOS transistor device in the second area 20, the high-k layer 114b serves as a gate dielectric layer, and the conductive layer 130b serves as a metal gate.

In the conventional method, the metal gate of a MOS transistor device is usually at a level lower than that of the control gate of a memory device, so the control gate is subjected to damage during the polishing step to the metal gate in an integrated process of forming a memory cell and a metal gate MOS transistor. However, in the present invention, since the control gate (e.g., conductive layer 130a) in the first area 10 is fabricated simultaneously and formed at substantially the same level with the metal gate (e.g., conductive layer 130b) in the second area 20, so the control gate of the invention is free of the damage during the polishing step to the metal gate.

In an embodiment, the high-k layer 114/114a in the first area 10 can be optionally removed after the step of forming the ONO dielectric layer 110 and before the step of forming conductive material layer 116, or after the step of removing the conductive layers 116a and 116b and before the step of filling the conductive layers 130a and 130b. A memory device of FIG. 2 is thereby formed, wherein the conductive layer 130a is in physical and direct contact with the ONO dielectric layer 110a.

Figure 2:
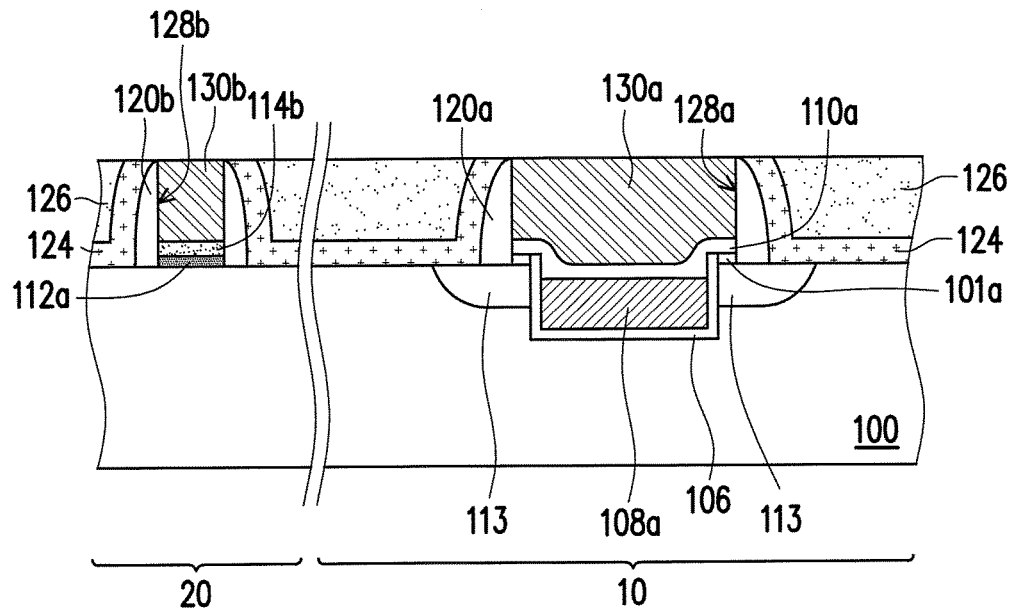
FIG. 2 is a schematic cross-sectional view of a semiconductor device according to another embodiment of the present invention.
Figure 3:
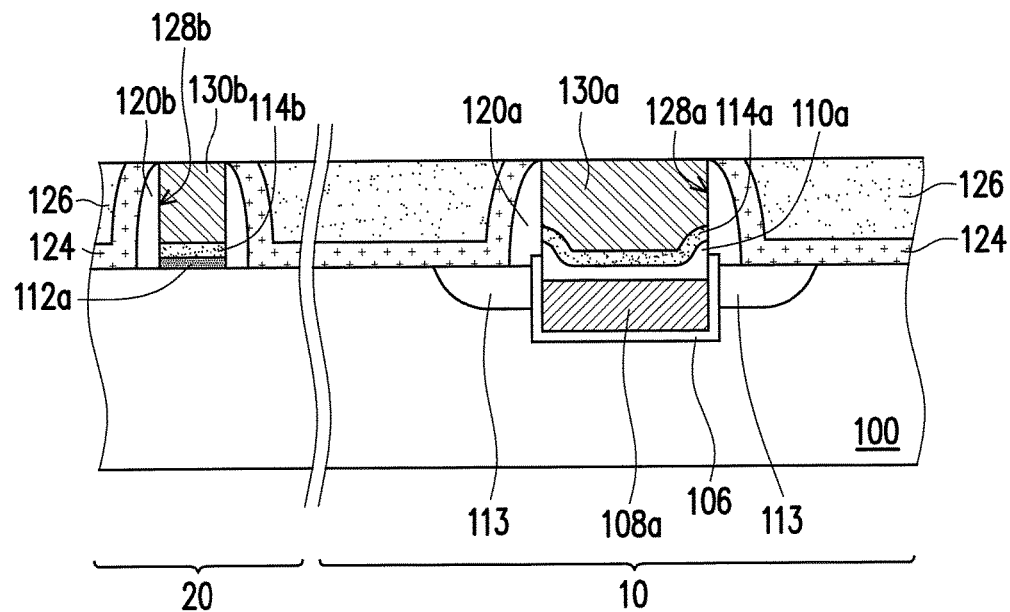
FIG. 3 is a schematic cross-sectional view of a semiconductor device according to yet another embodiment of the present invention.
Figure 4:
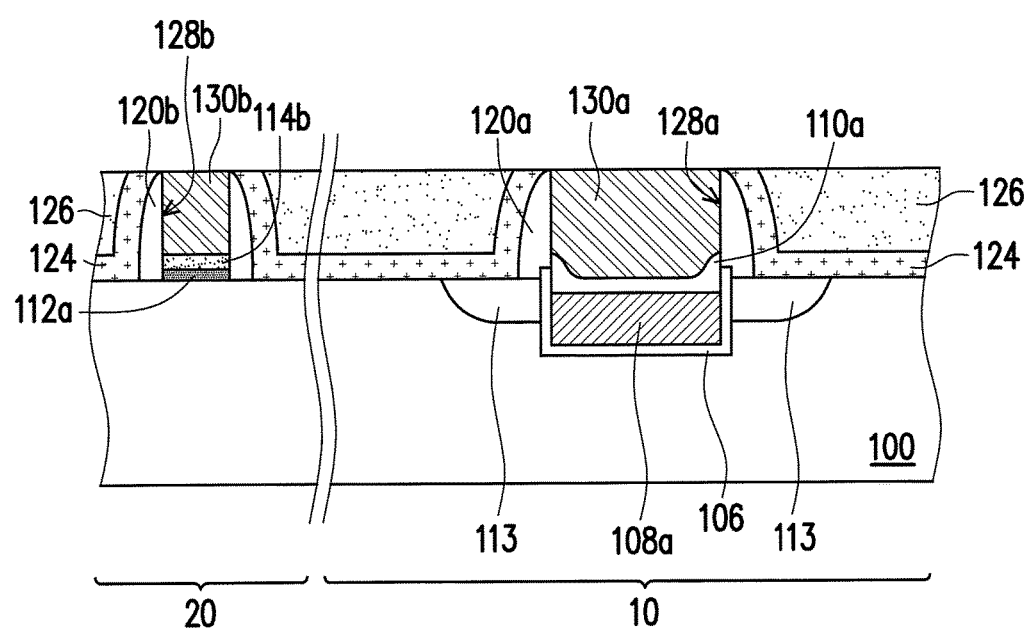
FIG. 4 is a schematic cross-sectional view of a semiconductor device according to still another embodiment of the present invention.

Besides, in the said embodiments, the control gate (e.g., conductive layer 130a) has a dimension or width greater than that of the floating gate (e.g., conductive layer 108a), as shown in FIG. 1H and FIG. 2, but the present invention is not limited thereto. In another embodiment, the control gate (e.g., conductive layer 130a) and the floating gate (e.g., conductive layer 108a) can have substantially the same dimension or width, as shown in FIG. 3 and FIG. 4.

FIG. 5A to FIG. 5E are schematic cross-sectional views of a method of forming a semiconductor device according to another embodiment of the present invention. The method of FIG. 5A to FIG. 5E is similar to that of FIG. 1A to FIG. 1H, in which the same reference numbers refer to the same or like elements, and the difference between them lies in that the step of forming an ONO dielectric layer is not implemented in the method of FIG. 5A to FIG. 5E.

Figure 5A:
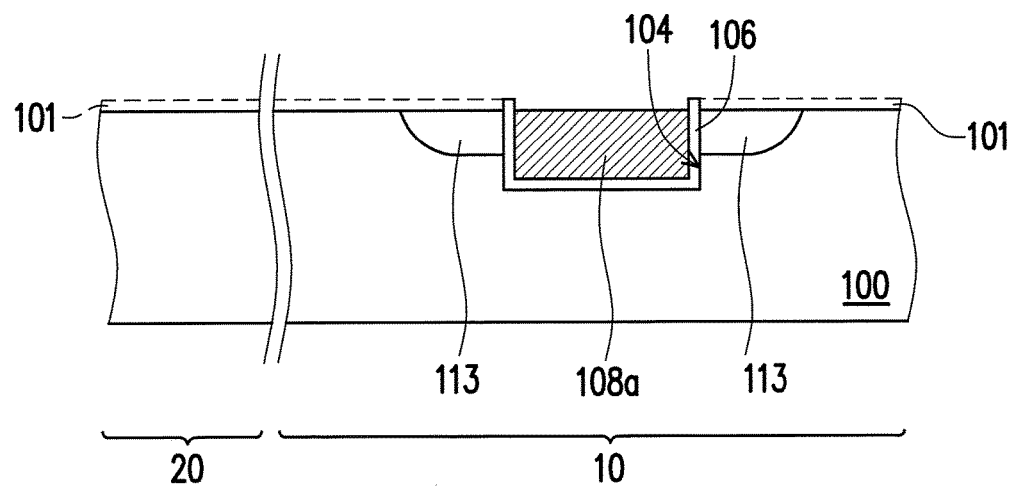
FIG. 5A to FIG. 5E are schematic cross-sectional views of a method of forming a semiconductor device according to another embodiment of the present invention.

Referring to FIG. 5A, a substrate 100 having first and second areas 10 and 20 is provided. The substrate 100 has a pad oxide layer 101 formed thereon. Besides, the substrate 100 has at least one opening 104 formed in the first area 10. An insulating layer 106 is formed on the surface of the opening 104. A conductive layer 108a is filled in the opening 104. The surface of the conductive layer 108a is no higher than the surface of the substrate 100. In this embodiment, the surface of the conductive layer 108a is substantially coplanar with the surface of the substrate 100. Thereafter, at least two doped regions 113 are formed in the substrate 100 beside the conductive layer 108a. In an embodiment, after the step of forming the doped regions 113, an etching process is performed to remove the pad oxide layer 101 on the substrate 100 in the first and second areas 10 and 20.

Figure 5B:
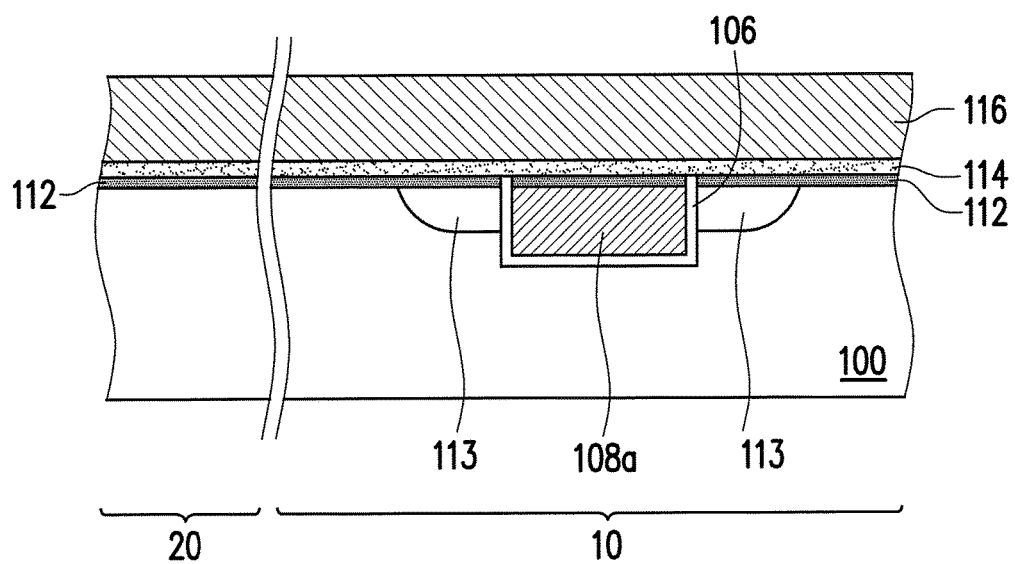

Referring to FIG. 5B, an interfacial layer 112 is formed on the substrate 100 in the first and second areas 10 and 20. The interfacial layer 112 includes silicon oxide, and the forming method thereof includes preforming a thermal oxidation process or a suitable deposition process such as CVD.

Thereafter, a high-k layer 114 is formed on the substrate 100 in the first and second areas 10 and 20. In an embodiment, the high-k layer 114 covers the interfacial layer 112 in the first and second areas 10 and 20. The method of forming the high-k layer 114 includes performing a suitable deposition process such as CVD. In an embodiment, the high-k layer 114 can be a high-k layer with a dielectric constant greater than about 4, greater than about 7 or even greater than about 10. For example, the high-k layer 114 includes metal oxide.

Thereafter, a conductive material layer 116 is faulted on the high-k layer 114 in the first and second areas 10 and 20. The conductive material layer 116 includes polysilicon, amorphous silicon or a combination thereof, and the forming method thereof includes performing a suitable deposition process such as CVD.

Figure 5C:
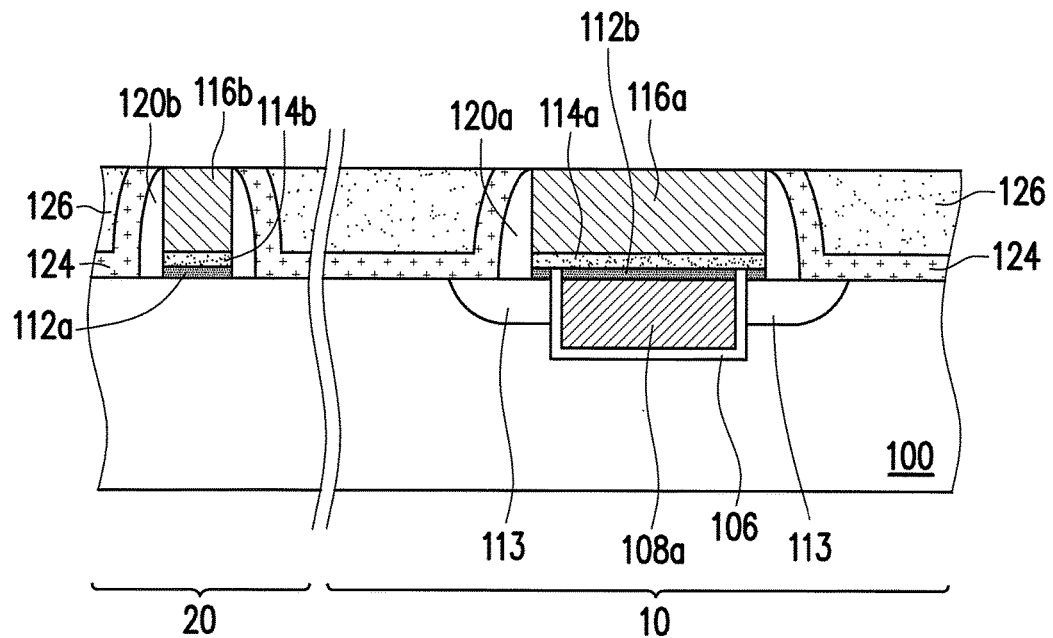

Referring to FIG. 5C, the conductive material layer 116 and the high-k layer 114 are patterned, so as to form a conductive layer 116a and an underlying high-k layer 114a in the first area 10, and simultaneously form a conductive layer 116b and an underlying high-k layer 114b on the substrate in the second area 20. The patterning step includes performing a photolithography and etching process. In an embodiment, this patterning step can simultaneously remove a portion of the interfacial layer 112, so the remaining interfacial layer 112a is formed below the high-k layer 114b, and the remaining interfacial layer 112b is formed between the high-k layer 114a and the conductive layer 108a. In an embodiment, the interfacial layer 112b is further formed between the high-k layer 114a and the substrate 100.

Thereafter, a dielectric layer 126 is formed around the conductive layers 116a and 116b. In an embodiment, the dielectric layer 126 surrounds the sidewalls and exposes the tops of the conductive layers 116 and 116b. In an embodiment, before the step of forming the dielectric layer 126, spacers 120a and 120b can be respectively formed on the sidewalls of the conductive layers 116a and 116b, and an etch stop layer 124 can be formed between the dielectric layer 126 and each of the spacers 120a and 120b and between the dielectric layer 126 and the substrate 100.

Figure 5D:
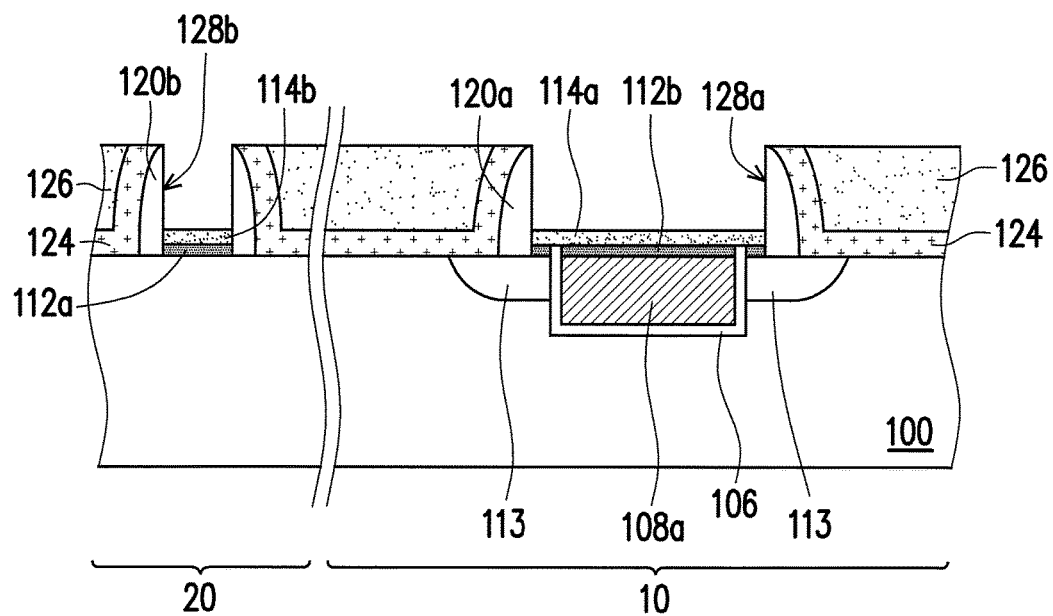

Referring to FIG. 5D, the conductive layers 116a and 116b are removed to form trenches 128a and trench 128b in the dielectric layer 126. The method of forming the conductive layers 116a and 116b includes performing an etching process. In this embodiment, the trenches 128a and 128b respectively expose the high-k layers 114a and 114b.

Figure 5E:
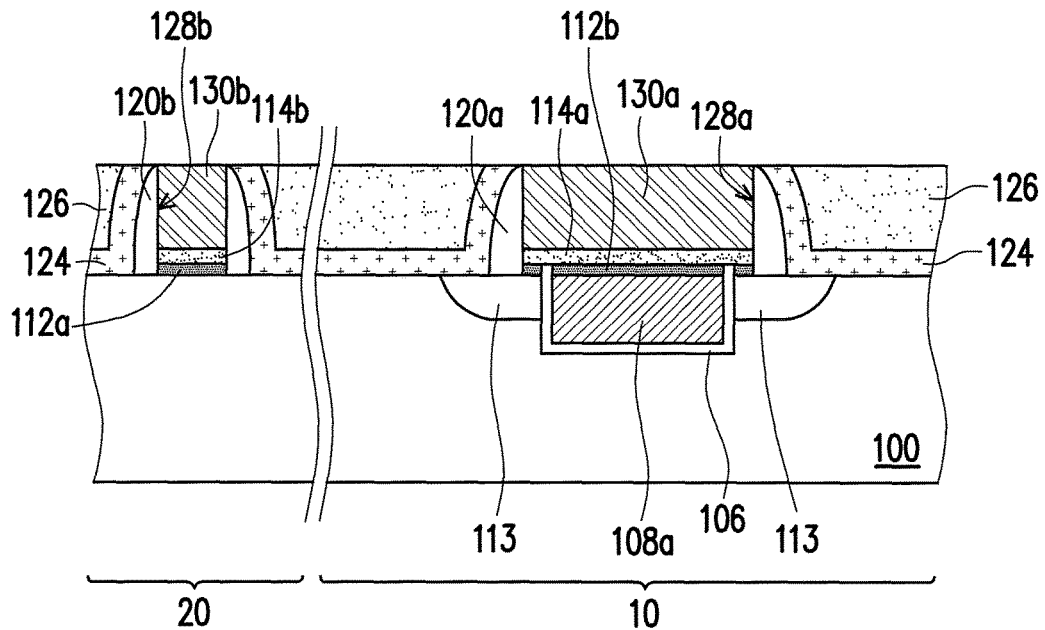

Referring to FIG. 5E, conductive layers 130a and 130b are respectively filled in the trenches 128a and 128b. Each of the conductive layers 130a and 130b includes metal. In an embodiment, each of the conductive layers 130a and 130b includes a work function metal layer and a low resistivity metal layer. The fabrication of the semiconductor device of the invention is thus completed.

In this embodiment, in the memory device in the first area 10, the insulating layer 106 serves as a tunnel insulating layer, the conductive layer 108a serves as a floating gate, the interfacial layer 112b and high-k layer 114a together serve as an inter-gate dielectric layer, and the conductive layer 130a serves as a control gate. In the MOS transistor device in the second area 20, the high-k layer 114b serves as a gate dielectric layer, and the conductive layer 130b serves as a metal gate.

In this embodiment, the control gate (e.g., conductive layer 130a) in the first area 10 and the metal gate (e.g., conductive layer 130b) in the second area 20 are formed simultaneously. Besides, the high-k dielectric layer 114a between the control gate and the floating gate in the first area 10 is formed simultaneously with the high-k layer 114b below the metal gate in the second area 20.

Figure 6:
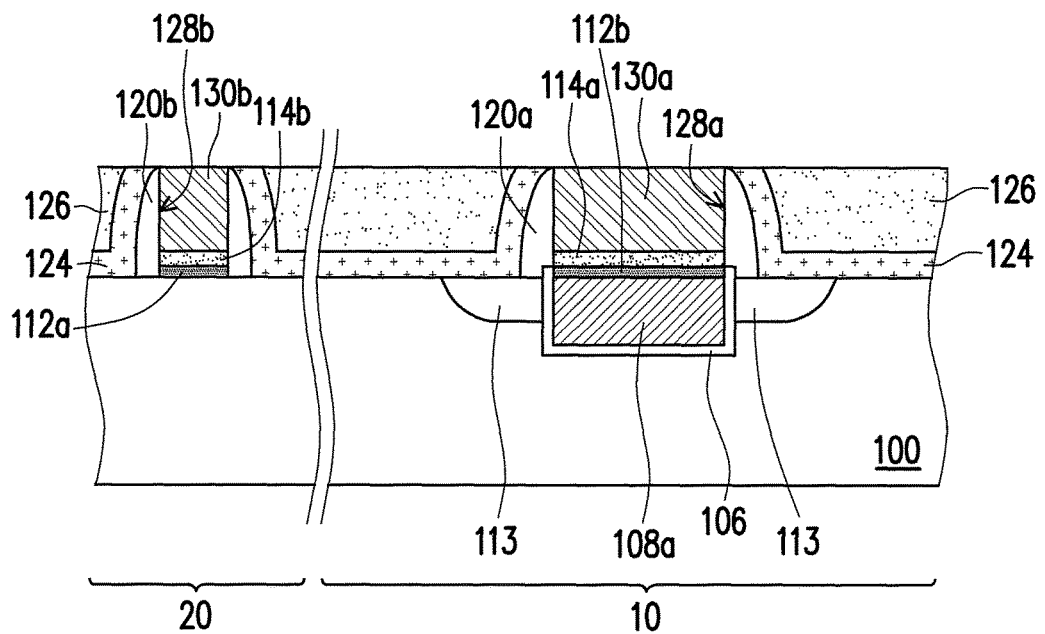
FIG. 6 is a schematic cross-sectional view of a semiconductor device according to yet another embodiment of the present invention.

In an embodiment, the control gate (e.g., conductive layer 130a) has a dimension or width greater than that of the floating gate (e.g., conductive layer 108a), as shown in FIG. 5E, but the present invention is not limited thereto. In another embodiment, the control gate (e.g., conductive layer 130a) and the floating gate (e.g., conductive layer 108a) have substantially the same dimension or width, as shown in FIG. 6.

The said embodiments in which the fabricating process of the memory device of the invention is integrated with that of the metal gate (high-k first) process are provided for illustration purposes, and are not construed as limiting the present invention. It is appreciated by people having ordinary skill in the art that the fabricating process of the memory device of the invention can be integrated with that of the metal gate (high-k last) process.

The memory device structures of the present invention are illustrated below with reference to FIG. 1H, FIG. 2 to FIG. 4, FIG. 5E and FIG. 6.

The memory device of the invention includes a first gate (e.g., conductive layer 108a), a second gate (e.g., conductive layer 130a), a tunnel insulating layer (e.g., insulating layer 106) and an inter-gate dielectric layer. The first gate is buried in the substrate 100. The second gate is disposed on the substrate 100, and the second gate includes metal. The tunnel insulating layer is disposed between the first gate and the substrate 100. The inter-gate dielectric layer is disposed between the first gate and the second gate. In an embodiment, the inter-gate dielectric layer is constituted by the ONO dielectric layer 110a and the high-k layer 114a, as shown in FIG. 1H and FIG. 3. In another embodiment, the inter-gate dielectric layer is merely constituted by the ONO dielectric layer 110a, as shown in FIG. 2 and FIG. 4. In yet another embodiment, the inter-gate dielectric layer is constituted by the interfacial layer 112b and the high-k layer 114a, as shown in FIG. 5E and FIG. 6.

In an embodiment, the dimension of the second gate is greater than that of the first gate, and the inter-gate dielectric layer is further disposed between the second gate and the substrate 100, as shown in FIG. 1H, FIG. 2 and FIG. 5E. In another embodiment, the first and second gates have substantially equal dimension, as shown in FIG. 3, FIG. 4 and FIG. 6.

Besides, the memory device of the invention further includes two doped regions 113 as source/drain regions disposed in the substrate 100 beside the first gate. In an embodiment, the depth of the first gate is greater than the depth of the doped regions 113

In summary, in the present invention, a floating gate in a cell area is buried in a substrate, and a control gate is fabricated simultaneously and formed at the same levels with a metal gate in a periphery area. By such manner, the control gate of the invention is not damaged during the polishing step to the metal gate. Moreover, in the present invention, a memory device and a MOS transistor device can be simultaneously fabricated with the semiconductor process for forming a metal gate, so the process cost is significantly reduced and the competitiveness is greatly improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor device, comprising:
a substrate having a cell area and a MOS device area;
a first gate, buried in an opening of the substrate in the cell area;
a second gate, disposed on the substrate in the cell area, wherein the second gate comprises metal;
an inter-gate dielectric layer, disposed between the first gate and the second gate; and
a third gate, disposed on the substrate in the MOS device area, wherein the third gate comprises metal,
wherein the inter-gate dielectric layer is in physical contact with an upper sidewall of the opening and further extends to directly cover a top corner of the opening, and
wherein an upper surface of the second gate and an upper surface of the third gate are coplanar and a bottom surface of the second gate and a bottom surface of the third gate are coplanar.

2. The semiconductor device of claim 1, wherein a dimension of the second gate is greater than a dimension of the first gate, and the inter-gate dielectric layer is further disposed between the second gate and the substrate.

3. The semiconductor device of claim 1, wherein the inter-gate dielectric layer comprises an oxide-nitride-oxide (ONO) dielectric layer, a high-dielectric-constant (high-k) layer having a dielectric constant of greater than about 10 or a combination thereof.

4. The semiconductor device of claim 3, wherein the high-k layer comprises metal oxide.

5. The semiconductor device of claim 1, further comprising a tunnel insulating layer disposed between the first gate and the substrate.

6. The semiconductor device of claim 1, further comprising at least two doped regions disposed in the substrate beside the first gate.

7. The semiconductor device of claim 6, wherein a depth of the first gate is greater than a depth of the doped regions.

8. A method of forming a semiconductor device, comprising:
providing a substrate having a cell area and a MOS device area, wherein the substrate has at least one opening formed in the cell area;
forming an insulating layer on a surface of the opening;
filling a first conductive layer in the opening to form a first gate; and
forming a first dielectric layer and a second conductive layer on the first conductive layer in the cell area and forming a third conductive layer on the substrate in the MOS device area, and
replacing each of the second conductive layer and the third conductive layer with a second gate and a third gate, respectively, wherein the second gate and the third gate comprise a metal gate, respectively,
wherein the first dielectric layer is in physical contact with an upper sidewall of the opening and further extends to directly cover a top corner of the opening, and
wherein an upper surface of the second gate and an upper surface of the third gate are coplanar and a bottom surface of the second gate and a bottom surface of the third gate are coplanar.

9. The method of claim 8, wherein the step of replacing each of the second conductive layer and the third conductive layer with a second gate and a third gate comprises:
forming a second dielectric layer around the second conductive layer and the third conductive layer;
removing the second conductive layer and the third conductive layer to form trenches in the second dielectric layer; and
filling a metal layer in the trenches.

10. The method of claim 9, wherein the second conductive layer and the third conductive layer comprise polysilicon, amorphous silicon or a combination thereof.

11. The method of claim 8, wherein the first dielectric layer comprises an ONO dielectric layer, a high-k layer having a dielectric constant greater than about 10 or a combination thereof.

12. The method of claim 8, wherein a surface of the first conductive layer is lower than a surface of the substrate.

13. The method of claim 8, wherein the first dielectric layer in the cell and a high-k layer below a metal gate in the MOS device area are formed simultaneously.

* * * * *